United States Patent
King

(10) Patent No.: US 6,486,671 B1
(45) Date of Patent: Nov. 26, 2002

(54) MRI IMAGE QUALITY IMPROVEMENT USING MATRIX REGULARIZATION

(75) Inventor: Kevin F. King, New Berlin, WI (US)

(73) Assignee: GE Medical Systems Global Technologies Company LLC, Waukesha, WI (US)

(*) Notice: Subject to any disclaimer, the term of this patent is extended or adjusted under 35 U.S.C. 154(b) by 72 days.

(21) Appl. No.: 09/855,105

(22) Filed: May 14, 2001

(51) Int. Cl.[7] ................................................. G01V 3/00
(52) U.S. Cl. ........................................ 324/307; 324/309
(58) Field of Search ................................. 324/307, 309, 324/306, 312, 314, 300, 318, 322

(56) References Cited

U.S. PATENT DOCUMENTS 6,160,398 A * 12/2000 Walsh ........................ 324/307
6,326,786 B1 * 12/2001 Pruessmann et al. ....... 324/309
6,380,741 B1 * 4/2002 Hajnal et al. ............... 324/307

* cited by examiner

Primary Examiner—Louis Arana
(74) Attorney, Agent, or Firm—Quarles & Brady, LLP; Carl Horton

(57) ABSTRACT

A method and apparatus for increasing the signal-to-noise ratio in a magnetic resonance image generated with a system including at least two receiver coils where the data acquisition period is reduced by increasing the space between k-space raster data rows such that image wrapping occurs and an unwrapping algorithm is required, the method including identifying a sensitivities matrix corresponding to the receiver coils, acquiring NMR signals and converting those signals to image pixel intensities, defining a correction matrix, altering the sensitivities matrix as a function of the correction matrix, combining the altered sensitivities matrix and the intensity matrix to generate an estimated spin density matrix and using a spin density matrix to generate the final image.

19 Claims, 6 Drawing Sheets

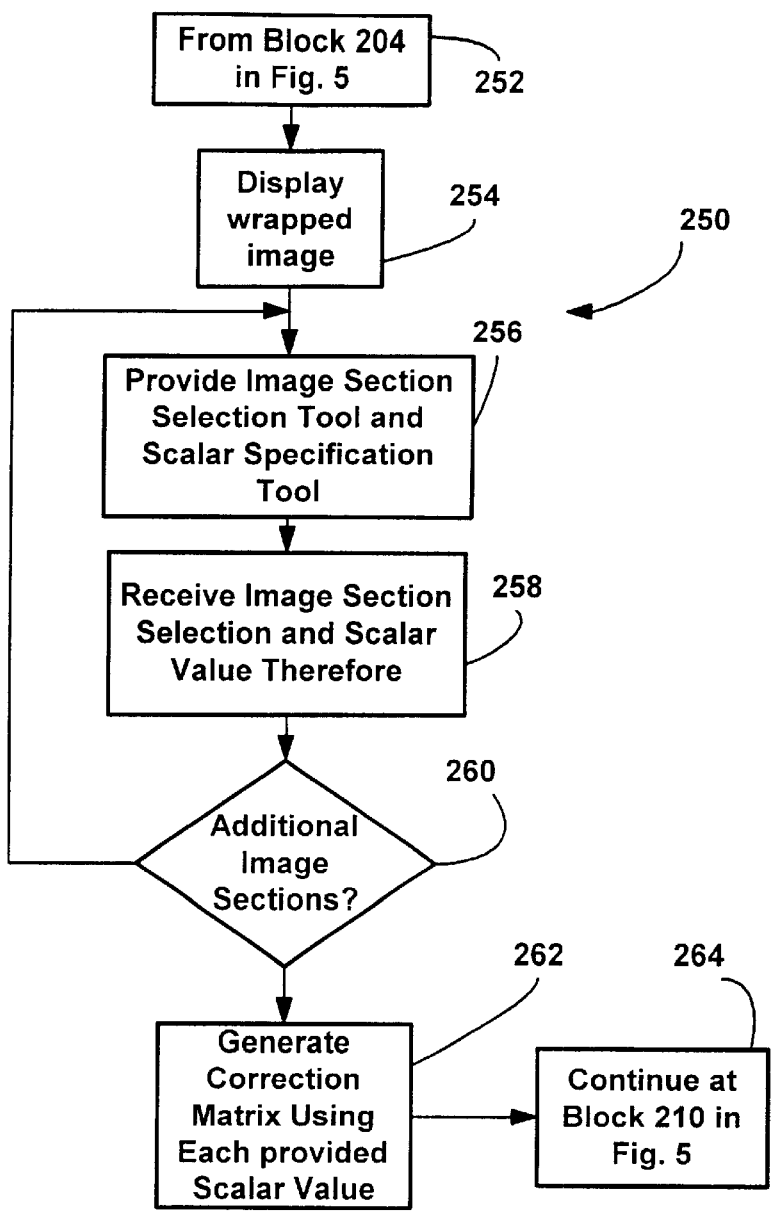

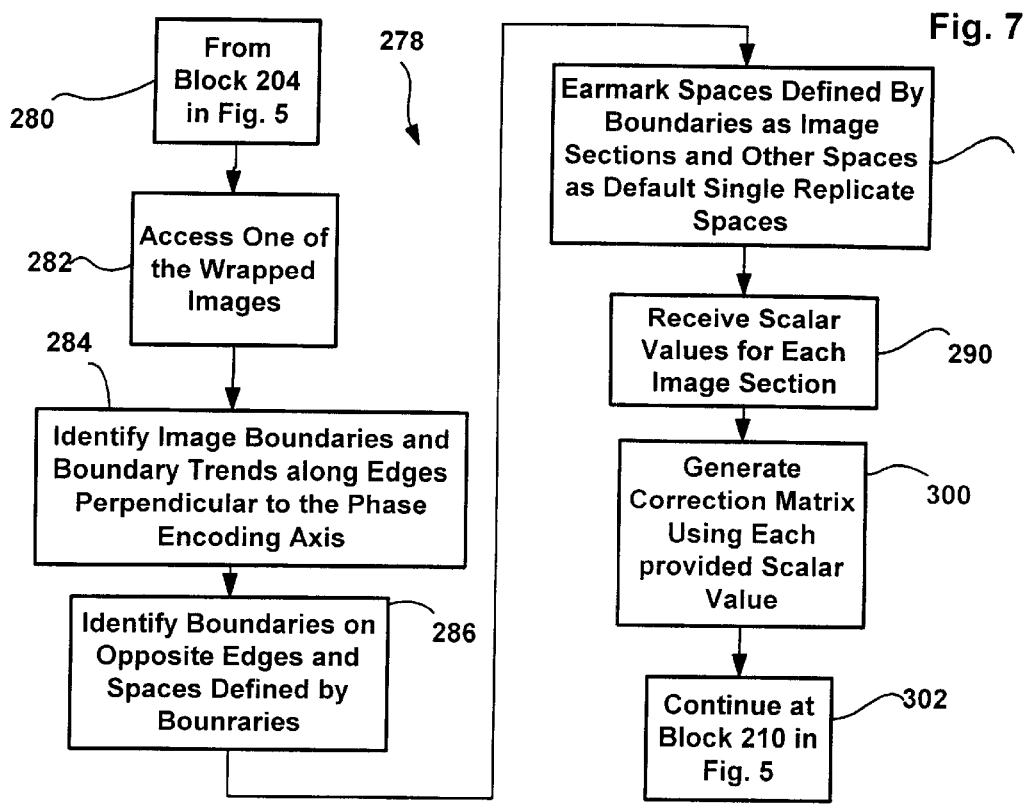

MRI IMAGE QUALITY IMPROVEMENT USING MATRIX REGULARIZATION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The field of the invention is nuclear magnetic resonance imaging ("MRI") methods and systems. More particularly, the invention relates to systems and methods for increasing the signal to noise ratio in MRI images where image data has to be unwrapped during data processing.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received by receiver coils and processed to form an image.

When utilizing these signals to produce images, magnetic field gradients ($G_x$ $G_y$ and $G_z$) are employed to select locations within the tissue for excitation. Typically, the region to be imaged is scanned by a sequence of measurement cycles in which gradients $G_x$ $G_y$ and $G_z$ vary according to the particular localization method being used. Herein it will be assumed that gradient $G_y$ is used to adjust the phase of signals along a phase encoding axis Y. The resulting set of received nuclear magnetic resonance (NMR) signals are digitized and stored in a k-space raster format. An exemplary k-space raster 10 is illustrated in FIG. 2 and includes a plurality of rows 12 of data. After all of the k-space data has been acquired, the data is typically subjected to a two-dimensional Fourier transform and the resulting data is then used to reconstruct an image using one of several different reconstruction techniques. An exemplary resulting image 14 is also illustrated in FIG. 2.

Thus, the intensity of each pixel in an MR image is generally a function of two factors. First, pixel signal intensity is a function of the spin density m at a point in an object slice being imaged that corresponds to the particular pixel in the image. Second, pixel signal intensity is also a function of the operating characteristics of the receiving coil that receives the NMR signal and converts the signal to an analog signal and then to a digital signal for storage in k-space. Specifically, the coil operating characteristic that affects the end pixel intensity the most is referred to as coil sensitivity s. Thus, intensity i for a pixel y can be expressed by the following Equation:

$$i(y)=s(y)m(Y) \quad \text{Equation 1}$$

There are several different factors that can be used to judge the value of any imaging system but two of the most important factors are the quality of the resulting images and the speed with which imaging data can be acquired. Higher quality images increase diagnostic value. Acquisition speed increases system throughput (i.e., the number of imaging sessions that can be performed in a given period) and can also increase image quality as patient movement is reduced when the acquisition period is chortened (i.e., patient movement is less likely during a shorter period than during a longer period. With MRI systems, throughput is extremely important as MRI systems are relatively expensive and the expense is in part justified by the amount of use a system receives.

One way to increase system throughput is to reduce the amount of data collected during an imaging session. For example, one way to reduce the amount of collected data is to increase the space between phase encoding lines in k-space. Referring to FIG. 3, an exemplary k-space raster 20 having half as many k-space lines as the raster 10 of FIG. 2 is illustrated. The time required to collect the data in raster 20 would be approximately half the time required to collect the data in raster 10.

By reducing the number of phase encoding lines employed during data acquisition, the field of view (FOV) along the phase encoding axis Y of the resulting image is also reduced. Referring again to FIG. 3, the FOV for the image 15 in FIG. 3 is shown as being approximately ½ the FOV in the image of FIG. 2 along the phase encoding axis Y. Where the object being imaged fits within the reduced FOV, the reduced FOV does not affect the resulting image. Because reducing the k-space phase encoded lines reduces the FOV, the factor by which the k space phase encoding lines are reduced is referred to as the reduction factor R.

Unfortunately, where the object being imaged extends outside the reduced FOV, the image sections that correspond to the out-of-FOV object sections "wrap around" on the image and are overlaid on other image sections. Thus, in FIG. 3, out-of-FOV image sections 22 and 24 wrap around and are overlaid on in-FOV image section 25 thereby generating wrapped sections 28 and 26, respectively. Each wrapped section (e.g., 22) includes pixel intensities that are the sum of two intensities corresponding to two different pixels in a non-wrapped image (i.e., in an image like that of FIG. 2). The two intensities that combine to produce each wrapped pixel intensity include one intensity corresponding to an in-FOV pixel and one intensity corresponding to an out-of-FOV pixel. For example, referring to FIGS. 2 and 3, the FOV of FIG. 3 is also illustrated in FIG. 2 by the space between lines 36 and 38 and thus when the FOV is reduced as in FIG. 3, pixel 30 is an in-FOV pixel and pixel 40 is an out-of-FOV pixel. Thus the pixel intensity of pixel 40 wraps as indicated by arrow 41 and is laid over pixel 30 intensity. Together the intensities of pixels 30 and 40 add to generate the intensity of pixel 42 upon wrapping.

Where the reduction factor R is greater than 2 additional image wrapping can occur thereby causing wrapped image pixels to include intensity corresponding to more than two (e.g., 3, 4, etc.) unwrapped pixels. This additional wrapping further reduces the diagnostic value of the resulting image.

The industry has devised ways to effectively "unwrap" wrapped images like the exemplary image in FIG. 3. It has been recognized that by providing several NMR signal receiving coils where the sensitivities of each coil are known, a permutation of Equation 1 above can be used to separate the intensity of a wrapped pixel into the in-FOV intensity and the out-of-FOV intensity. To this end, along a phase encoding axis the intensity of a wrapped pixel y corresponding to first and second receiver coils can be expressed as:

$$i_1(y)=s_1(y)m(y) +s_1(y+D)m(y+D) \quad \text{Equation 2}$$

$$i_2(y)=s_2(y)m(y) +s_2(y+D)m(y+D) \quad \text{Equation 3}$$

respectively, where D is the phase encoding FOV (see FIG. 3).

Referring still to Equations 2 and 3, assuming that the sensitivities $s_1$ and $s_2$ for each of the first and second coils are known, after intensity data has been acquired for each of the first and second coils, only m(y) and m(y+D) are unknown. Thus, Equations 2 and 3 can be solved for each of the unknowns to determine the spin densities m(y) and m(y+D) at pixels y and y+D, respectively. The spin densities at each pixel can then be converted to intensities to "unwrap" the image.

By increasing the reduction factor R, the amount of data acquired is reduced and therefore throughput is accelerated. The number of unknowns, however, that can be resolved in any system is equal to the number of separate receiver coils in the system. Thus, in any given system the maximum reduction factor R is equal to the number of receiver coils N. For example, in the exemplary system described above that includes four receiver coils the maximum reduction factor R is 4.

In general terms, the intensity of a particular wrapped pixel y with a reduction factor R can be expressed by the equation:

$$i_j(y) = \sum_{k=0}^{R-1} s_j(y+kd)m(y+kD) \quad \text{Equation 4}$$

where j refers to coil number and $s_j(y)$ refers to the sensitivity of coil j.

In a system including N coils, intensity, spin density and sensitivity matrices I, M and S can be defined as having dimensions N×1, R×1 And N×R, respectively, and Equation 4 can be rewritten in matrix form as:

$$I=SM \quad \text{Equation 5}$$

Again, assuming S is known, S can be inverted and Equation 5 can be rewritten and solved for an estimated spin density M as:

$$\hat{M}=S^{-1}I \quad \text{Equation 6}$$

A solution of Equation 6 that can be relied upon should minimize the spin density estimate error. Thus, a typical solution to Equation 6 minimizes $|S\hat{M}-I|^2$ resulting in the following equation:

$$\hat{M}=[(S^+S)^{-1}S^+]I \quad \text{Equation 7}$$

where + denotes the Hermitian conjugate.

Obviously the value of the solution to Equation 7 is only as good as the preciseness with which the sensitivities of the coils can be determined. Unfortunately, while the industry has devised several ways to determine coil sensitivities, there are many factors that affect sensitivities such that noise often occurs upon inversion of the sensitivity matrix S that propagates and is exacerbated in resulting images. Thus, while solving Equation 7 in theory provides a way to unwrap image data, in practice the resulting image has a relatively low signal to noise ratio (SNR).

BRIEF SUMMARY OF THE INVENTION

The present invention is a method for reducing the noise in an unwrapped image by modifying the coil sensitivity matrix and using the modified matrix instead of the original matrix to determine the spin densities of image pixels by solving an equation similar to Equation 7 above.

More specifically, one way to increase the SNR is to minimize the function $A(\hat{M})+\lambda B(\hat{M})$ where $A(\hat{M})=|S\hat{M}-I|^2$, $\lambda$ is an adjustable parameter and $B(\hat{M})$ is chosen to reduce system sensitivity to noise. For some square matrix H, $B(\hat{M})$ may have the form $B(\hat{M})=\hat{M}+H\hat{M}$ where, again the + indicates the Hermitian conjugate. With $B(\hat{M})$ expressed in the above form, Equation 7 can be rewritten as:

$$\hat{M}=[(S^+S+\lambda H)^{-1}S^+]I \quad \text{Equation 8}$$

Because high noise often results in large pixel values a simple solution to Equation 8 is to minimize the magnitude of $\hat{M}$ so that $B(\hat{M})=\hat{M}^+\hat{M}$ giving H=U where U is the unit matrix. Thus, Equation 8 can be rewritten as:

$$\hat{M}=[(S^+S+\lambda U)^{-1}S^+]I \quad \text{Equation 9}$$

Upon solving Equation 9 the resulting spin density estimates $\hat{M}$ can be used to generate an unwrapped image with relatively high SNR.

In addition to several methods the invention also includes an apparatus for performing each of the methods.

These and other aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 6 is a flow chart illustrating a manual method for identifying image sectors having disparate replicates; and FIG. 7 is a flow chart similar to FIG. 6, albeit being an automated method.

DETAILED DESCRIPTION OF THE INVENTION

Figure 1:
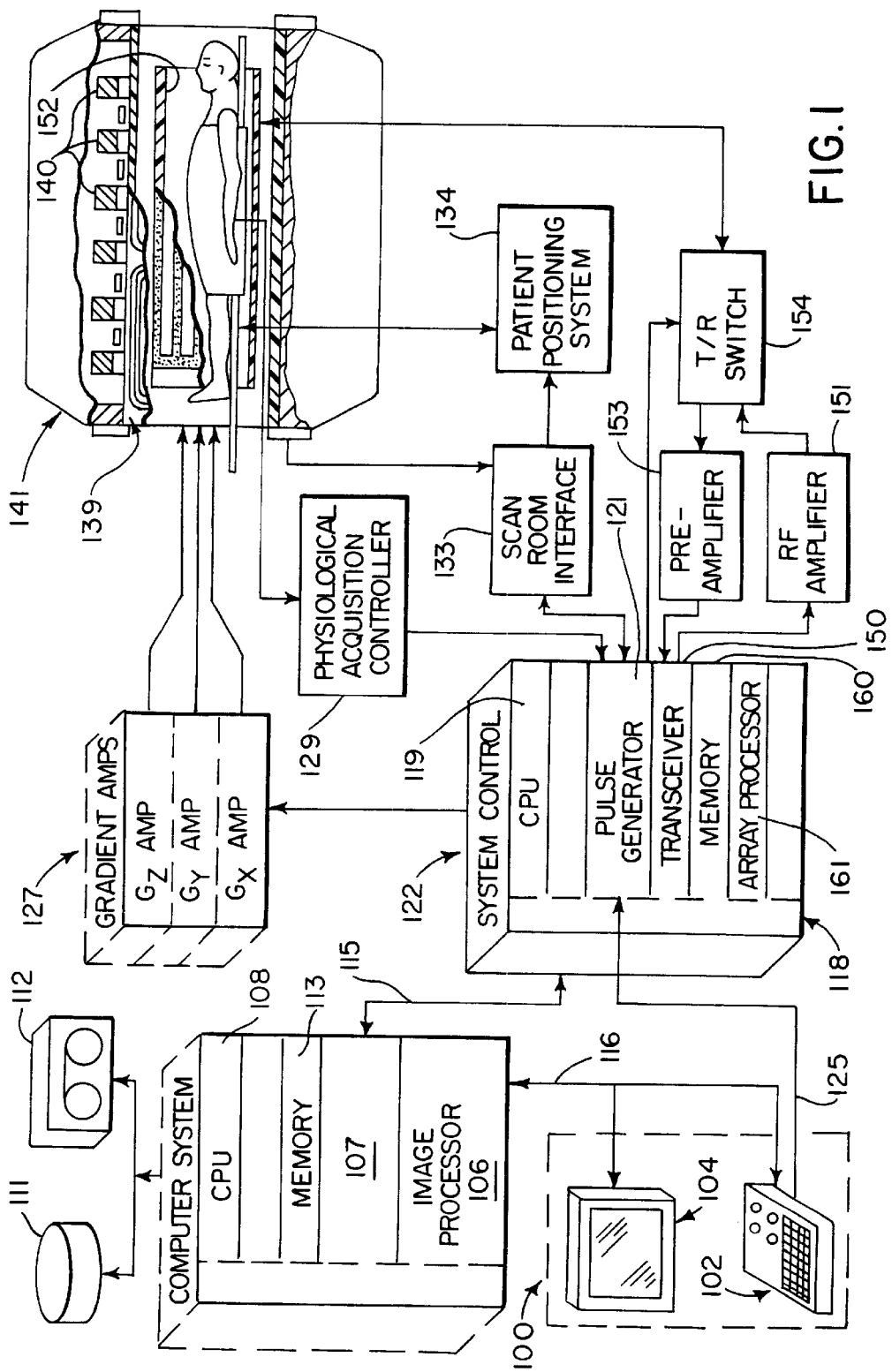
FIG. 1 is a schematic view of a MR imaging system that performs the method of FIG. 5.

Referring first to FIG. 1, there is shown the major components of an exemplary MRI system that incorporates the present invention. Operation of the system is controlled from an operator console 100 that includes a keyboard or control panel 102 and a display 104. The console 100 communicates through a link 116 with a separate computer system 107 that enables an operator to control the production and display of images on the display 104. Computer system 107 includes a number of modules that communicate with each other through a backplane. The communicating modules include an image processor module 106, a CPU module 108 and a memory module 113, known in the art as a frame buffer for storing image data arrays. Computer system 107 is linked to a disk storage 111 and a tape drive 112 for storage of image data and programs. System 107 communicates with a separate system control 122 through a high-speed serial link 115.

The system control 122 includes a set of modules connected together by a backplane. The connected modules include a CPU module 119 and a pulse generator module 121 that connects to operator console 100 through a serial link 125. It is through this link 125 that the system control 122 receives commands from the operator that indicate the scan sequence that is to be performed. The pulse generator module 121 operates the system components to carry out the desired scan sequence. Generator module 121 produces data that indicates the timing, strength and shape of the RF pulses that are to be produced and the timing of and length of the data acquisition window. Pulse generator module 121 connects to a set of gradient amplifiers 127 and indicates the timing and shape of gradient pulses to be produced during the scan.

Pulse generator module 121 also receives patient data from a physiological acquisition controller 129 that receives signals from a number of different sensors connected to the patient, such as ECG signals from electrodes or respiratory signals from a bellows. In addition, pulse generator module 121 connects to a scan room interface circuit 133 that receives signals from various sensors associated with the condition of the patient and the magnet system. A patient positioning system 134 also receives commands to move the patient to the desired position for scanning through the scan room interface circuit 133.

The gradient waveforms produced by pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses that are amplified by an RF amplifier 151 and coupled to the RF coil 152 via a transmit/receive (T/R) switch 154. The T/R switch 154 is controlled by a signal from the pulse generator module 121 to electrically connect the RF amplifier 151 to coil 152 during the transmit mode and to connect the preamplifier 153 to separate receiver coils (see FIG. 4) in assembly 141 during a receive mode.

Figure 4:
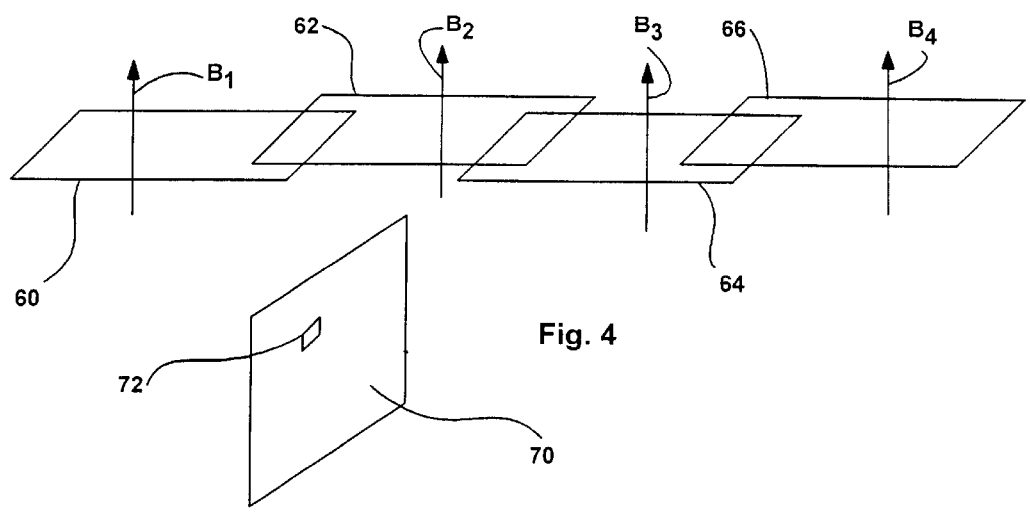
FIG. 4 is a schematic view of a receiver coil configuration, an imaging plane and an enlarged point within the imaging plane.

Referring also to FIG. 4, the exemplary magnet assembly 141 of FIG. 1 includes four separate receiver coils 60, 62, 64 and 66. Coils 60, 62, 64 and 66 are shown in a simple configuration to simplify this explanation but other configurations are contemplated. Thus, point 72 generates a signal in each of coils 60, 62, 64 and 66. An exemplary imaging plane 70 is also illustrated and an enlarged space corresponding to an exemplary point within plane 70 is identified by numeral 72. NMR signals radiated by excited nuclei in a patient generate signals that cumulatively cause magnetic fields $B_1$ through $B_4$ that are detected by the coils 60, 62, 64 and 66, respectively. Thus, point 72 generates a signal that affects each of fields $B_1$ through $B_4$ and hence information about point 72 is present in coil signals. Similarly every other point within plane 70 generates a signal that affects each of fields $B_1$ through $B_4$. Each of the fields sensed by coils 60, 62, 64 and 66 is converted into data that cumulatively is used to generate an MR image.

To this end, each of coils 60, 62, 64 and 66 is coupled to a preamplifier 153. After amplification, the NMR signals picked up by coils 60, 62, 64 and 66 are demodulated, filtered, and digitized by the receiver section of the transceiver module 150 and transferred to a memory module 160 in system control 122. The data collected is stored in k-space rasters, a separate raster corresponding to each coil 60, 62, 64 and 66. When the scan is completed and an entire array of data has been acquired in memory module 160, an array processor 161 performs a Fourier transform on each of the four k-space rasters to generate four separate images corresponding to the received NMR data. The image data is stored as four separate arrays of pixel intensities. Thereafter the data from the four separate images can be combined to generate a single NMR image of relatively high quality.

Figure 2:
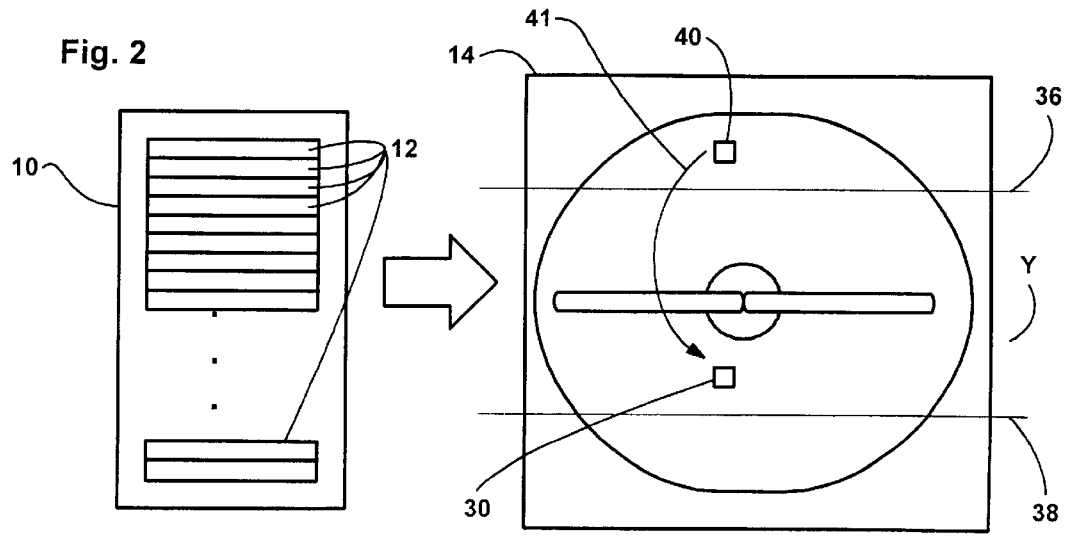
FIG. 2 is a schematic view of a k-space raster and a resulting image.
Figure 3:
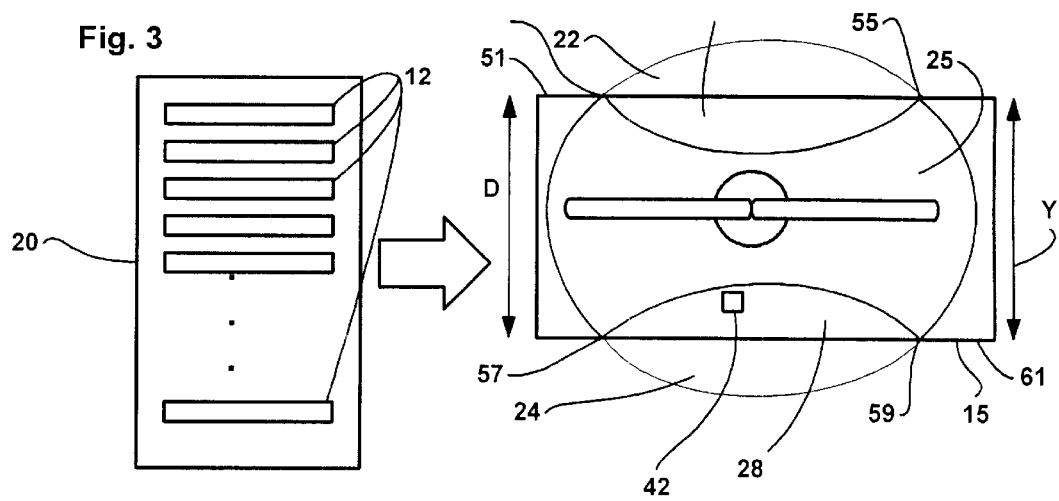
FIG. 3 is similar to FIG. 2, albeit illustrating a k-space raster with relatively greater space between k-space data rows and a resulting reduced FOV image.

Referring to FIG. 2, where a large number of k-space rows of data 112 are accumulated, the resulting image 14 has a relatively large dimension along the phase encoding axis Y and therefore relatively large objects can be imaged. Unfortunately, the time required to complete a data acquisition is proportional to the amount of data collected. One way to increase acquisition speed is to reduce the amount of data collected by increasing the space between k-space rows of data collected as illustrated in FIG. 3. The resulting image 15 has a reduced dimension D along the phase encoding axis Y and may, depending upon the dimension of the object being imaged along axis Y, cause the resulting image to wrap such that various pixels within the resulting image include intensity data corresponding to two or more locations within the object being imaged. The invention includes a method performed by the processors of the FIG. 1 system to effectively unwrap the wrapped sections of a reduced FOV image while maintaining a high SNR.

Figure 5:
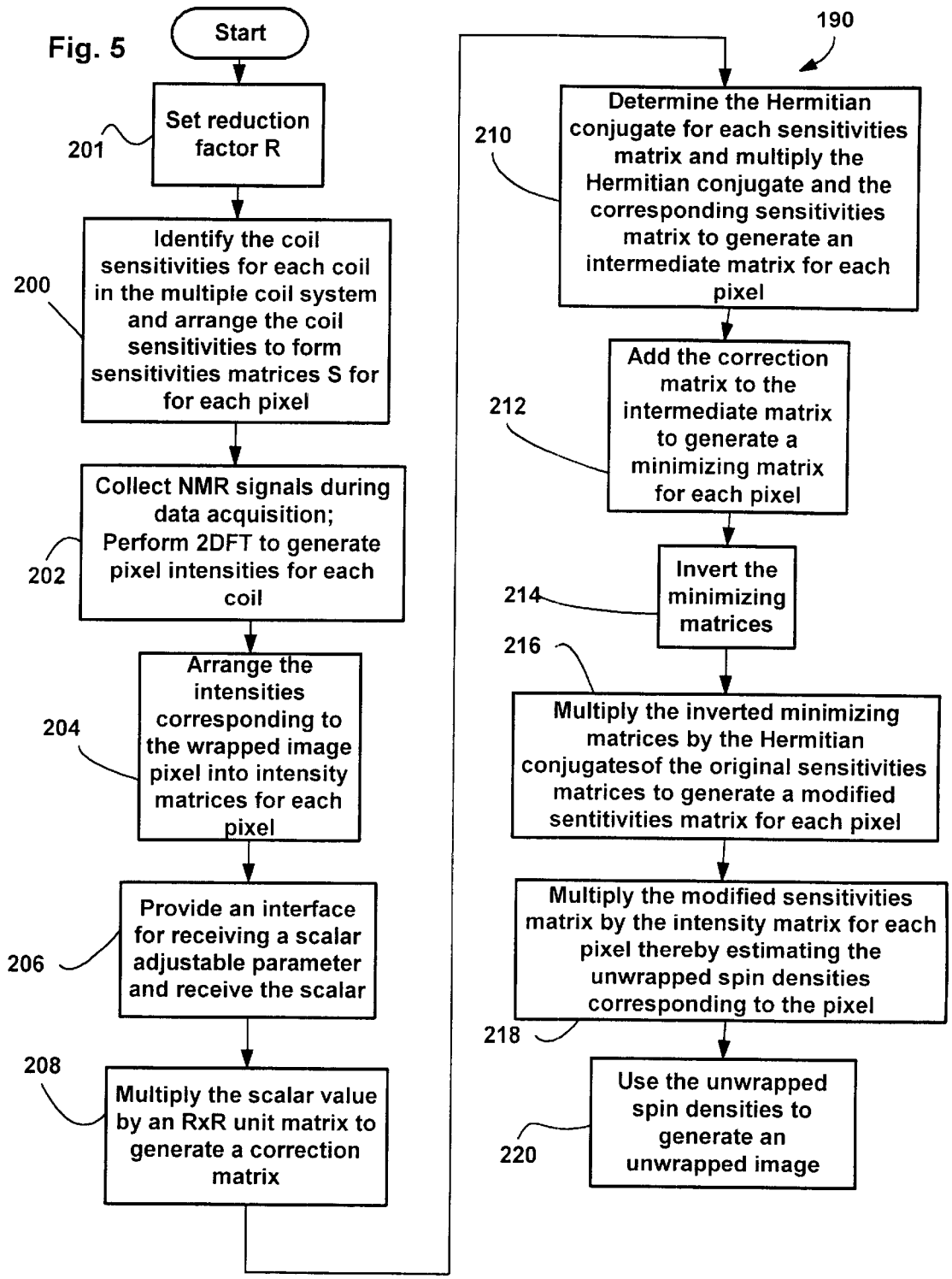
FIG. 5 is a flow chart illustrating an exemplary method according to the present invention.

Referring now to FIG. 5, an exemplary inventive method 190 is illustrated. Referring also to FIG. 1, at process block 201, using interface 100 in FIG. 1, a system user can determine the speed with which MR data is collected by setting a FOV reduction factor R. Reduction factor R has a range between 1 and N where N is the number of receiver coils within assembly 141. In the present example, the number of receiver coils N is 4 and therefore the maximum value for reduction factor R is 4. Thus, in the present example, reduction factor R may have the values 1, 2, 3 or 4. Where the reduction factor R is set to 1, the space between k-space rows is minimized such that the largest amount of data possible is collected and the data acquisition period is relatively long. Where the reduction factor R is set to 4, the space between k-space rows of data is maximized such that the minimum amount of data is collected during an acquisition and the acquisition period is minimized.

Continuing at block 200, the components of the system illustrated in FIG. 1 are used to identify coil sensitivities for each of coils 60, 62, 64, and 66 (see also FIG. 4). To this end, the coil sensitivities are measured during a commissioning procedure whereby an object having known MRI qualities is positioned within an imaging volume inside magnetic assembly 141. With the object inside the imaging volume 141, gradients are applied via assembly 127 and the object generates NMR signals that are picked up by the coils 60, 62, 64 and 66. The coils provide the signals to the receiver portion of transceiver 150 which demodulates, filters and digitizes the signals providing separate k-space rasters for each one of coils 60, 62, 64 and 66. Next, a Fourier transform is applied to each of the k-space rasters to generate pixel intensities corresponding to a resulting image.

Because the magnetic resonance characteristics of the test object are known, the spin densities of the materials that form the object are known. Therefore, referring to equation 1 above, after the test images corresponding to each coil are completed and pixel intensities have been determined, Equation 1 can be solved for sensitivity s (i.e., each of intensities i and spin density m are known) and therefore the sensitivities corresponding to each coil for each point within the imaging space inside the imaging volume can be determined. At block 200 the coil sensitivities are arranged to form a sensitivities matrix S for each of the pixels that will exist in a wrapped image to be subsequently generated.

Referring still to FIGS. 1 and 5, after commissioning has been completed and the sensitivities matrices S have been formed, a data acquisition procedure can commence. At process block 202 NMR signals are collected during a data acquisition period. The NMR signals are stored in k-space rasters, a separate raster corresponding to each of coils 60, 62, 64 and 66. Next, at block 202, image processor 106 (see FIG. 1) performs a two-dimensional Fourier transform on each of the k-space rasters to generate a separate image for each of coils 60, 62, 64 and 66. The resulting images comprise pixel intensities for pixels within a wrapped image like the image 15 illustrated in FIG. 3.

At process block 204, processor 106 arranges the intensities corresponding to the wrapped image pixels from all of the images into intensity matrices i, one matrix for each pixel in the wrapped image. At block 206, processor 106 provides an interface via display 104 for the system user to provide a scalar or adjustable parameter λ. The interface may include instructions on how λ is used or the effect of λ on a resulting image. The value for λ will be restricted to between 0 and 1 in the present example. Where λ is relatively large, the amount of noise reduction is increased. However, where is λ is large (i.e., relatively close to 1), while noise reduction is appreciable, some uncorrected aliasing can occur. Therefore, the optimal value for λ will depend upon a system user's judgment regarding acceptable noise and acceptable uncorrected aliasing. At block 206 the adjustable scalar λ is received by processor 106 via interface 100.

At process block 208 processor 106 multiplies the scalar value λ by an R–R unit matrix to generate a correction matrix λH. At block 210, processor 106 determines the Hermitian conjugates $S^+$ of the sensitivity matrices S (i.e., one for each pixel) and multiplies the Hermitian conjugates $S^+$ sensitivities matrices S to generate intermediate matrices $S^+S$, one for each pixel.

At block 212, processor 106 adds the correction matrices λH to corresponding intermediate matrices $S^+S$ to generate minimizing matrices, $(S^+S+\lambda H)$. At block 214 process 106 inverts each minimizing matrix $(S^+S+\lambda H)$ to generate an inverted minimizing matrix.

At block 216 processor 106 multiplies the each inverted minimizing matrix by the corresponding Hermitian conjugate $S^+$ of the original sensitivities matrix S to generate the modified sensitivities matrix $[(S^+S+\lambda H)^{-1}S^+]$. At block 218 processor 106 multiplies the modified sensitivities matrices by corresponding intensity matrices I to determine the unwrapped spin densities for the pixels y and y+D in an unwrapped image for the separate images corresponding to coils 60, 62, 64 and 66. Continuing, at block 220, processor 106 uses the unwrapped spin densities to generate an unwrapped image using data corresponding to all four coils 60, 62, 64 and 66. Thus, the system of FIG. 1 solves Equation 9 above to determine the spin densities of unwrapped pixels and then uses the spin densities to generate an image with a high SNR.

The exemplary method described above improves SNR substantially, especially at the maximum acceleration factor where reduction factor R is equal to the number of receiver coils N in an imaging system. During testing of a system using the method described above where the reduction factor R was set to 4, it was determined that a reasonable trade-off between SNR and uncorrected aliasing was achieved with a scalar value λ set equal to $10^{-3}$ independent of pulse sequence parameter, scan plane and coil properties. For this value of scalar λ, noise near the center of the image decreased by 20%.

Referring again to FIG. 3, it should be appreciated that in a wrapped image certain parts of the image will include more noise than other image parts. For example, wrapped image section 26 that includes information corresponding to two points in an object being imaged instead of one will generally have more noise content than other image sections (e.g. 25) that only include information corresponding to a single point in the object being imaged. Hereinafter the number of points for which a single pixel includes information is referred to as the number of replicates. For instance, where two points contribute information to a pixel, the number of replicates is two, where three points contribute information to a pixel the number of replicates is three and so on.

Because noise in pixels including greater numbers of replicates is relatively higher than in pixels including lesser numbers of replicates, an optimal system should attenuate the noise to a greater degree when unwrapping higher replicate pixels than when unwrapping lower replicate pixels.

To this end, according to one embodiment of the invention boundaries of objects within a wrapped image are determined so that image areas including higher numbers of replicates and hence higher noise can be distinguished from areas of lower relative noise (i.e., lower number of replicates). Thereafter different scalar λ values can be set or automatically selected for the areas of low and high relative noise so that, upon unwrapping the SNR throughout the resulting image is similar.

Referring to FIG. 6, a method 250 for setting different λ values for different image sections is illustrated. Referring also to FIG. 5, the method of FIG. 6 is a sub-method of FIG. 5 and begins at block 252 after intensities have been arranged into intensity matrices at block 204. Next, referring also to FIG. 1, at block 254, a system user instructs processor 106 to display one of the wrapped images (e.g., the wrapped image corresponding to coil 60) via display 104.

At block 256 a selection tool is also provided for the user to select sections of the displayed wrapped image for λ specification. For instance, a mouse controlled cursor or the like may be provided that allows the user to select a general area on the displayed image. When the general area is selected, processor 106 may be programmed to identify a most likely boundary for the specific area and then to highlight the area within the boundary and provide an accept icon or the like for the user to accept the area highlighted. For example, referring again to FIG. 3, if a user were to indicate any point within space 26, processor 106 would highlight entire space 26 and provide the acceptance icon. In addition, at block 256 processor 106 allows the user to indicate a scalar value λ for the image section selected.

At block 258 processor 106 receives the section selection and scalar value λ setting and stores that information. Next, at block 260 processor 106 asks the user if scalar λ values have to be set for additional image sections. If additional λ values have to be set, control passes back to block 256 where the process is repeated. If all λ values have been specified, control passes to block 262

At block 262 processor 106 uses the scalar values λ specified above to generate two different correction matrices, one for pixels in spaces 26 and 28 and another for pixels in space 25. control passes back to block 210 in FIG. 5 where further processing continues to unwrap the wrapped images (see block 264).

While the manual process above for identifying image sections can be used, other more automated processes can be used. For example, given the reduction factor R, processor 106 can determine the likely or potential overlapping that could occur in a wrapped image and then could search for telltale signs of image sections having different replicate numbers. Where R is 2 generally there would only be pixels having one or two replicates and at most there should be three separate image sections (one section including single replicate pixels and two sections each including two replicate pixels).

One automated method 278 is illustrated in FIG. 7, where starting at block 204 in FIG. 5 (see block 280), control passes to block 282 where processor 106 accesses one of the wrapped images. At block 284 processor 106 searches to identify image boundaries along edges perpendicular to the phase encoding axis for image sections that appear to be cut off. For instance, in FIG. 3 processor 106 would search for disparate pixel intensities along edge 51 and locate points 53 and 55. Having located points 53 and 55 processor 106 can determine the general trends of the boundaries that terminate at those points. At block 286 processor 106 identifies points 57 and 59 at the same locations along the axis perpendicular to the Y-axis along the opposite edge 61 of the image. Thereafter, at block 288 processor 106 continues the boundary trends identified at the other edge (e.g., at points 53 and 55) to identify space 28 as one of the image sections including two replicate pixels and earmarks that space as such.

A similar process is performed to identify space 26 as the second image section including two replicate pixels. The remaining section 25 by default includes single replicates.

In the present example, after identifying the separate sections 25, 26 and 28, at block 290 processor 106 requests two different scalar values, one for the single replicate section 25 and the other for each of two replicate sections 26 and 28. Thereafter, at block 300 processor 106 generates two separate correction matrices using the scalar values and then, at block 302 control passes back to block 210 of FIG. 5.

It should be understood that the methods and apparatuses described above are only exemplary and do not limit the scope of the invention, and that various modifications could be made by those skilled in the art that would fall under the scope of the invention.

To apprise the public of the scope of this invention, the following claims are made:

What is claimed is:

1. A method for use with a multiple receiver coil magnetic resonance imaging (MRI) system used to generate a two dimensional slice image through an object where the field of view during data acquisition is smaller than the object cross section to be imaged such that upon transforming acquired k space data into image data, the resulting wrapped images include wrapped image sections where wrapped pixel intensities include intensity from each of a properly located pixel and at least one wrapped pixel, each receiver coil receiving an MRI signal from each location within the object cross section and having a coil specific sensitivity that indicates how the coil reacts to signals from the different points within the slice, the method for increasing the signal to noise ratio of image pixels upon unwrapping of wrapped image sections, the method comprising the steps of, for each pixel in the wrapped images:

identifying the coil sensitivities for each coil in the multiple coil system and arranging the coil sensitivities to form a sensitivities matrix S for the pixel;

arranging the intensities from each coil corresponding to the image pixel into an intensity matrix;

generating a modified coil sensitivities matrix S' by modifying sensitivities matrix S;

inverting the modified sensitivities matrix;

multiplying the inverted matrix by the intensity matrix to generate a spin densities matrix including unwrapped pixel spin densities corresponding to the pixel; and using the spin densities matrix to generate a final image.

2. The method of claim 1 wherein the step of generating the modified sensitivities matrix S' includes mathematically combining a correction matrix with the sensitivities matrix S to generate a minimizing matrix.

3. The method of claim 2 wherein the step of mathematically combining includes determining the Hermitian conjugate of the sensitivity matrix and mathematically combining the Hermitian conjugate and the sensitivities matrix to generate an intermediate matrix and mathematically combining the intermediate matrix and the correction matrix.

4. The method of claim 3 the step of mathematically combining to generate the intermediate matrix includes the step of multiplying the Hermitian matrix and the sensitivities matrix.

5. The method of claim 4 wherein the step of mathematically combining to generate the minimizing matrix includes the step of adding the correction matrix and the intermediate matrix.

6. The method of claim 5 wherein the correction matrix is a diagonal matrix.

7. The method of claim 6 further including the step of forming the diagonal matrix by multiplying a scalar by a unit matrix.

8. The method of claim 7 further including the step of providing an interface for receiving the scalar, receiving the scalar and then multiplying the scalar value by the unit matrix to generate the correction matrix.

9. The method of claim 8 wherein different wrapped image sections include intensity information from different numbers of wrapped pixels and wherein the step of receiving a scalar includes receiving at least two different scalars, a first a scalar for image sections including intensity information from a first number of wrapped pixels and a second scalar including intensity information from a second number of wrapped pixels.

10. The method of claim 9 further including the step of identifying each of the different wrapped image sections and providing a separate scalar for each of the different image sections.

11. The method of claim 8 wherein the step of generating a modified sensitivities matrix further includes the step of inverting the minimizing matrix and multiplying the inverted minimizing matrix by the Hermitian conjugate of the sensitivities matrix.

12. An apparatus for use with a multiple receiver coil magnetic resonance imaging (MRI) system used to generate a two dimensional slice image through an object where the field of view during data acquisition is smaller than the object cross section to be imaged such that upon transforming acquired k space data into image data, the resulting wrapped image includes wrapped image sections where wrapped pixel intensities include intensity from each of a properly located pixel and at least one wrapped pixel, each receiver coil receiving an MRI signal from each location within the object cross section and having a coil specific sensitivity that indicates how the coil reacts to signals from the different points within the slice, the apparatus for increasing the signal to noise ratio of final image pixels upon unwrapping of at least one wrapped pixel, the apparatus comprising, for each pixel in a wrapped image:

means for identifying the coil sensitivities for each coil in the multiple coil system and arranging the coil sensitivities to form a sensitivities matrix S;

means for arranging the intensities corresponding to the pixel into an intensity matrix;

means for generating a modified coil sensitivities matrix S' by modifying sensitivities matrix S;

means for inverting the modified sensitivities matrix;

means for multiplying the inverted matrix by the intensity matrix to generate a spin densities matrix for final image pixels corresponding to the pixel; and using the spin densities matrix to generate the final image.

13. The apparatus of claim 12 wherein the means for generating the modified sensitivities matrix S' includes means for mathematically combining a correction matrix with the sensitivities matrix S to generate a minimizing matrix.

14. The apparatus of claim 13 wherein the means for mathematically combining includes means for determining the Hermitian conjugate of the sensitivity matrix, means for mathematically combining the Hermitian conjugate and the sensitivities matrix to generate an intermediate matrix and means for mathematically combining the intermediate matrix and the correction matrix.

15. The apparatus of claim 14 wherein the means for mathematically combining to generate the intermediate matrix includes means for multiplying the Hermitian matrix and the sensitivities matrix.

16. The apparatus of claim 15 wherein the means for mathematically combining to generate the minimizing matrix includes means for adding the correction matrix and the intermediate matrix.

17. The apparatus of claim 16 further including means for providing an interface for receiving the scalar, means for receiving the scalar and means for multiplying the scalar value by the unit matrix to generate the correction matrix.

18. The apparatus of claim 17 wherein the means for generating a modified sensitivities matrix further includes means for inverting the minimizing matrix and means for multiplying the inverted minimizing matrix by the Hermitian conjugate of the sensitivities matrix.

19. An apparatus for use with a multiple receiver coil magnetic resonance imaging (MRI) system used to generate a two dimensional slice image through an object where the field of view during data acquisition is smaller than the object cross section to be imaged such that upon transforming acquired k space data into image data, the resulting wrapped image includes wrapped image sections where wrapped pixel intensities include intensity from each of a properly located pixel and at least one wrapped pixel, each receiver coil receiving an MRI signal from each location within the object cross section and having a coil specific sensitivity that indicates how the coil reacts to signals from the different points within the slice, the method for increasing the signal to noise ratio of image sections upon unwrapping of the wrapped image sections, the method comprising, for each pixel in a wrapped image:

identifying the coil sensitivities for each coil in the multiple coil system and arranging the coil sensitivities to form a sensitivities matrix S;

arranging the intensities corresponding to the wrapped image pixel from each coil into an intensity matrix;

generating a modified coil sensitivities matrix S' by modifying sensitivities matrix S;

inverting the modified sensitivities matrix;

multiplying the inverted matrix by the intensity matrix to generate a spin densities matrix for final image pixels corresponding to the wrapped image pixel; and using the spin densities matrix to generate the MR image.

\* \* \* \* \*